United States Patent
Okawa et al.

(10) Patent No.: US 9,311,995 B2
(45) Date of Patent: Apr. 12, 2016

(54) SEMICONDUCTOR MEMORY DEVICE AND CONTROL METHOD THEREOF

(71) Applicant: KABUSHIKI KAISHA TOSHIBA, Minato-ku (JP)

(72) Inventors: Takamasa Okawa, Yokkaichi (JP); Takayuki Tsukamoto, Yokkaichi (JP); Yoichi Minemura, Yokkaichi (JP); Hiroshi Kanno, Yokkaichi (JP); Atsushi Yoshida, Yokkaichi (JP); Hideyuki Tabata, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/306,843

(22) Filed: Jun. 17, 2014

(65) Prior Publication Data

US 2015/0228337 A1    Aug. 13, 2015

Related U.S. Application Data

(60) Provisional application No. 61/939,039, filed on Feb. 12, 2014.

(51) Int. Cl.
*G11C 8/08* (2006.01)
*G11C 13/00* (2006.01)
*G11C 5/02* (2006.01)
(Continued)

(52) U.S. Cl.
CPC ............ *G11C 13/0035* (2013.01); *G11C 5/02* (2013.01); *G11C 13/0002* (2013.01); *G11C 13/0026* (2013.01); *G11C 29/024* (2013.01); *H01L27/101* (2013.01); *G11C 7/18* (2013.01); *G11C 2029/5006* (2013.01); *G11C 2213/71* (2013.01)

(58) Field of Classification Search
CPC ...... G11C 13/0035; G11C 5/02; G11C 13/00; G11C 29/02; G11C 29/028; G11C 11/401
USPC .............................................. 365/51, 230.03
See application file for complete search history.

(56) References Cited

U.S. PATENT DOCUMENTS 4,685,086 A * 8/1987 Tran ............................. 365/203
6,041,002 A * 3/2000 Maejima ..................... 365/201
(Continued)

FOREIGN PATENT DOCUMENTS

JP     2008-269741     11/2008
JP     2010-93261     4/2010
(Continued)

*Primary Examiner* — Richard Elms
*Assistant Examiner* — Xiaochun L Chen
(74) *Attorney, Agent, or Firm* — Oblon, McClelland, Maier & Neustadt, L.L.P.

(57) ABSTRACT

A semiconductor memory device comprises: first lines disposed in a first direction perpendicular to a substrate and extending in a second direction parallel to the substrate; second lines disposed in the second direction and configured to extend in the first direction, the second lines intersecting the first lines; and memory cells disposed at intersections of the first lines and the second lines and each including a variable resistance element. Furthermore, a third line extends in a third direction orthogonal to the first and second directions. A select transistor is connected between the second and third lines. A control circuit controls a voltage applied to the first and third lines, and the select transistor. The control circuit renders conductive at least one of the select transistors and thereby detect a current flowing in the third line, and determines a deterioration state of the select transistor according to a detection result.

10 Claims, 18 Drawing Sheets

(51) Int. Cl.
*H01L 27/10* (2006.01)
*G11C 29/02* (2006.01)
*G11C 7/18* (2006.01)
*G11C 29/50* (2006.01)

(56) References Cited

U.S. PATENT DOCUMENTS 7,660,148 B2   2/2010  Yokoi
7,995,374 B2   8/2011  Komura et al.
8,289,793 B2  10/2012  Kanda
8,848,415 B2 *  9/2014  Scheuerlein et al. ........... 365/51
2010/0096628 A1  4/2010  Song et al.
2012/0147689 A1 *  6/2012  Scheuerlein et al. .... 365/230.03

FOREIGN PATENT DOCUMENTS

JP   4881400   2/2012
JP   4901930   3/2012

* cited by examiner

SEMICONDUCTOR MEMORY DEVICE AND CONTROL METHOD THEREOF

CROSS REFERENCE TO RELATED APPLICATIONS

This application is based on and claims the benefit of priority from prior U.S. Provisional Patent Application No. 61/939,039, filed on Feb. 12, 2014, the entire contents of which are incorporated herein by reference.

FIELD

Embodiments relate to a semiconductor memory device and a control method thereof.

BACKGROUND

In recent years, ReRAM (Resistive RAM) in which a variable resistance element that reversibly changes its resistance value is utilized as memory, has been proposed. Moreover, in this ReRAM, a structure where the variable resistance element is provided between a word line extending parallel to a substrate and a bit line extending perpendicularly to the substrate, is known. This structure enables an even higher degree of integration of a memory cell array to be achieved. In a memory cell array of such a structure, a plurality of the bit lines are connected to one global bit line, via select transistors.

However, in the memory cell array of such a structure, as the number of times of executions of a write operation/erase operation to a memory cell increases, the select transistor gradually deteriorates. So a memory cell in a periphery of the select transistor may cause a write defect. Therefore, it is important to detect deterioration of such a select transistor.

DETAILED DESCRIPTION

A semiconductor memory device according to an embodiment described below comprises: a plurality of first lines disposed in a first direction perpendicular to a substrate and configured to extend in a second direction parallel to the substrate; a plurality of second lines disposed in the second direction and configured to extend in the first direction, the plurality of second lines intersecting the plurality of first lines; and a plurality of memory cells disposed at intersections of the plurality of first lines and the plurality of second lines and each including a variable resistance element. Furthermore, a third line is configured to extend in a third direction orthogonal to the first direction and the second direction. A select transistor is connected between the second line and the third line. A control circuit controls a voltage applied to the first line, the third line, and the select transistor. The control circuit is configured to render conductive at least one of a plurality of the select transistors and thereby detect a current flowing in the third line, and to determine a deterioration state of the select transistor according to a result of detection.

Next, various kinds of embodiments will be described in detail with reference to the drawings.

First Embodiment

Configuration

Figure 1:
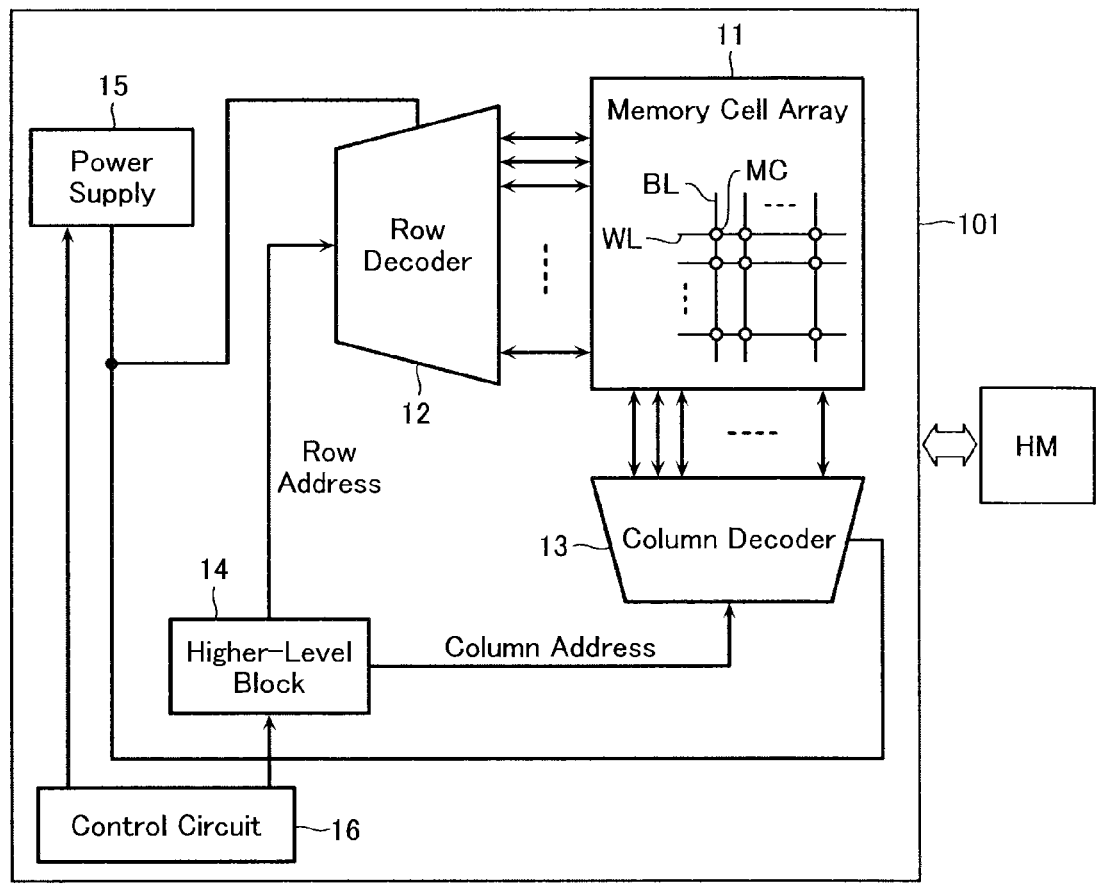
FIG. 1 is an example of a block diagram of a semiconductor memory device according to a first embodiment.

First, an overall configuration of a semiconductor memory device according to a first embodiment will be described. FIG. 1 is an example of a block diagram of the semiconductor memory device according to the first embodiment. As shown in FIG. 1, a semiconductor memory device 101 includes a memory cell array 11, a row decoder 12, a column decoder 13, a higher-level block 14, a power supply 15, and a control circuit 16.

The memory cell array 11 includes a plurality of word lines WL and bit lines BL that intersect each other, and memory cells MC disposed at intersections of these word lines WL and bit lines BL. The row decoder 12 selects the word line WL during access (data erase/write/read). The column decoder 13 selects the bit line BL during access, and includes a driver that controls an access operation.

The higher-level block 14 selects the memory cell MC which is to be an access target in the memory cell array 11. The higher-level block 14 provides a row address and a column address to, respectively, the row decoder 12 and the column decoder 13. The power supply 15 generates certain combinations of voltages corresponding to each of operations of data erase/write/read, and supplies these combinations of voltages to the row decoder 12 and the column decoder 13. The control circuit 16 performs control of, for example, sending the addresses to the higher-level block 14, and, moreover, performs control of the power supply 15, based on a command from an external HM.

Figure 2:
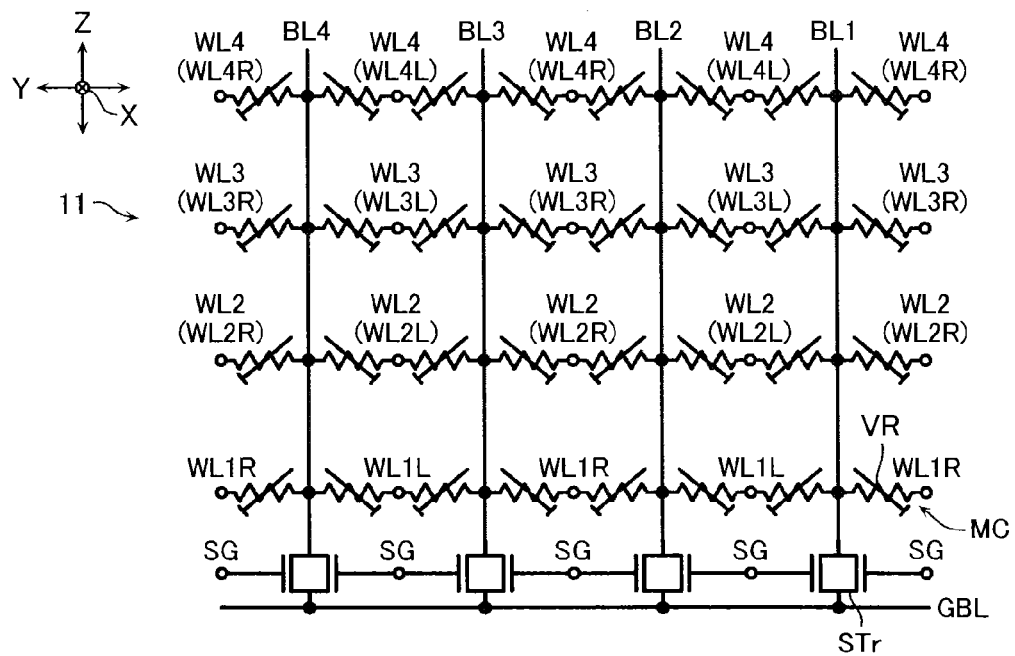
FIG. 2 is an example of a circuit diagram of a memory cell array 11 according to the first embodiment.
Figure 3:
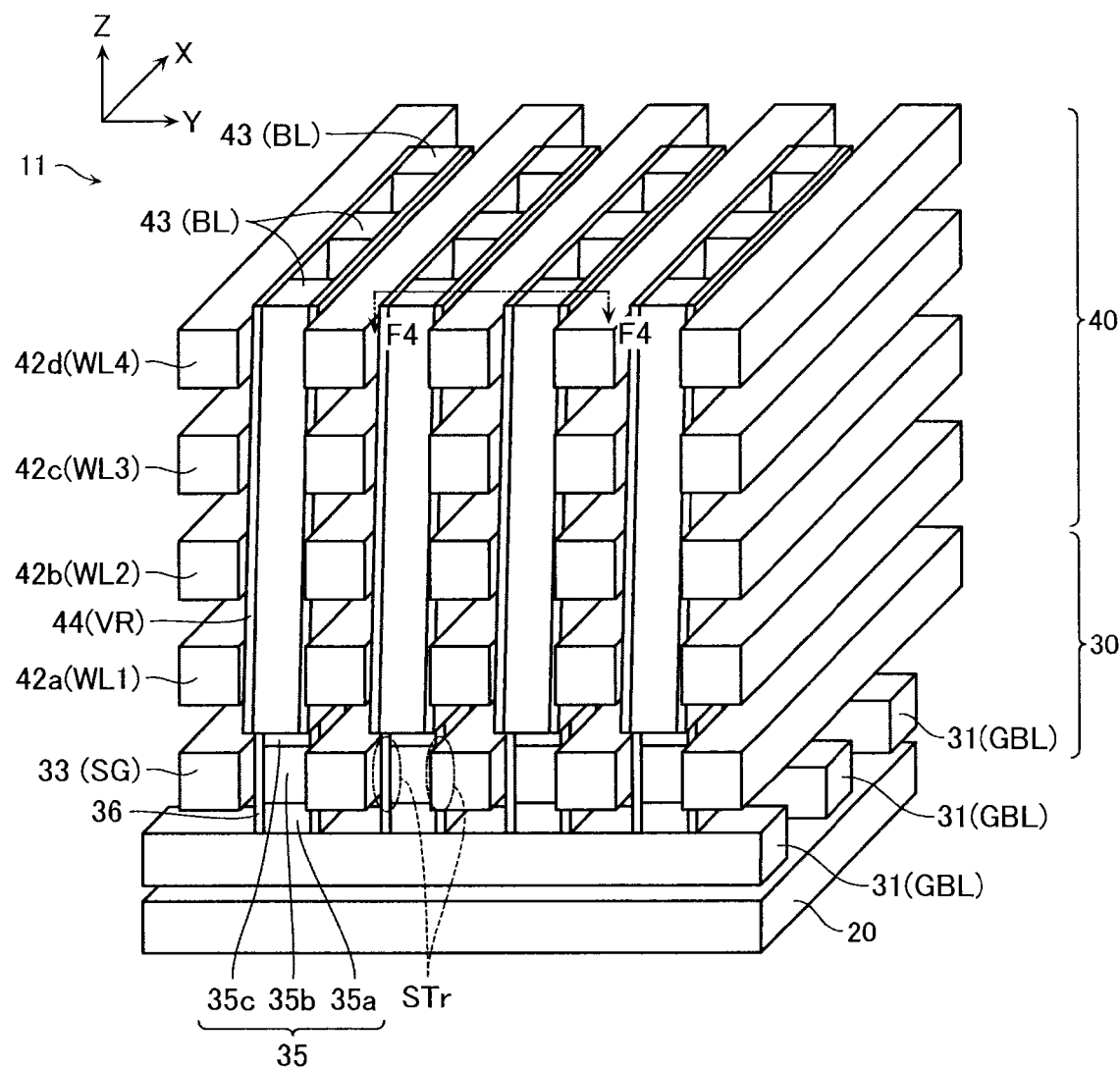
FIG. 3 is an example of a perspective view showing a stacked structure of the memory cell array 11 according to the first embodiment.

Next, the memory cell array 11 according to the first embodiment will be described in detail with reference to FIGS. 2 and 3. FIG. 2 is an example of a circuit diagram of the memory cell array 11. FIG. 3 is an example of a perspective view showing a stacked structure of the memory cell array 11. Note that in FIG. 2, an X direction, a Y direction, and a Z direction are orthogonal to each other, and the X direction is a direction perpendicular to a plane of paper. In addition, a structure shown in FIG. 2 is provided repeatedly in the X direction.

As shown in FIG. 2, the memory cell array 11 includes a select transistor STr, a global bit line GBL, and a select gate line SG, in addition to the above-mentioned word line WL, bit line BL, and memory cell MC.

As shown in FIGS. 2 and 3, word lines WL1 to WL4 are arranged in the Z direction with a certain pitch, and extend in the X direction. The bit lines BL are arranged in a matrix in the X direction and the Y direction, and extend in the Z direction. The memory cells MC are disposed at places where these word lines WL and bit lines BL intersect. Therefore, the memory cells MC are arranged in a three-dimensional matrix in the X, Y, and Z directions.

As shown in FIG. 2, the memory cell MC includes a variable resistance element VR. A resistance value of the variable resistance element VR changes between a high-resistance state and a low-resistance state based on an applied voltage, whereby the memory cell MC stores data in a nonvolatile manner based on that resistance value. The variable resistance element VR changes from the high-resistance state (reset state) to the low-resistance state (set state) by a setting operation that applies a certain constant voltage or more to both ends of the variable resistance element VR, and changes from the low-resistance state (set state) to the high-resistance state (reset state) by a resetting operation that applies a certain constant voltage or more to both ends of the variable resistance element VR. In addition, the variable resistance element VR, immediately after manufacturing, is in a state where its resistance state is not easily changed, and is in a high-resistance state. Accordingly, a forming operation is executed. In the forming operation, a high voltage greater than or equal to that of the setting operation and the resetting operation is applied to both ends of the variable resistance element VR. As a result of this forming operation, a region (filament path) where locally it is easy for a current to flow is formed in the variable resistance element VR, whereby the variable resistance element VR can have its resistance state changed easily, and achieves a state of being operable as a storage element.

As shown in FIG. 2, the select transistor STr is provided between the global bit line GBL and one end of the bit line BL. The global bit lines GBL are aligned with a certain pitch in the X direction, and extend in the Y direction. One global bit line GBL is commonly connected to one ends of a plurality of select transistors STr arranged in a line in the Y direction.

In addition, gate electrodes of two select transistors STr arranged adjacently in the Y direction can be commonly connected. The select gate lines SG are aligned with a certain pitch in the Y direction, and extend in the X direction. One select gate line SG is commonly connected to gates of a plurality of the select transistors STr arranged in a line in the X direction. Note that it is also possible to separate gate electrodes between two select transistors STr arranged adjacently in the Y direction and thereby operate each of the two select transistors STr independently.

Figure 4:
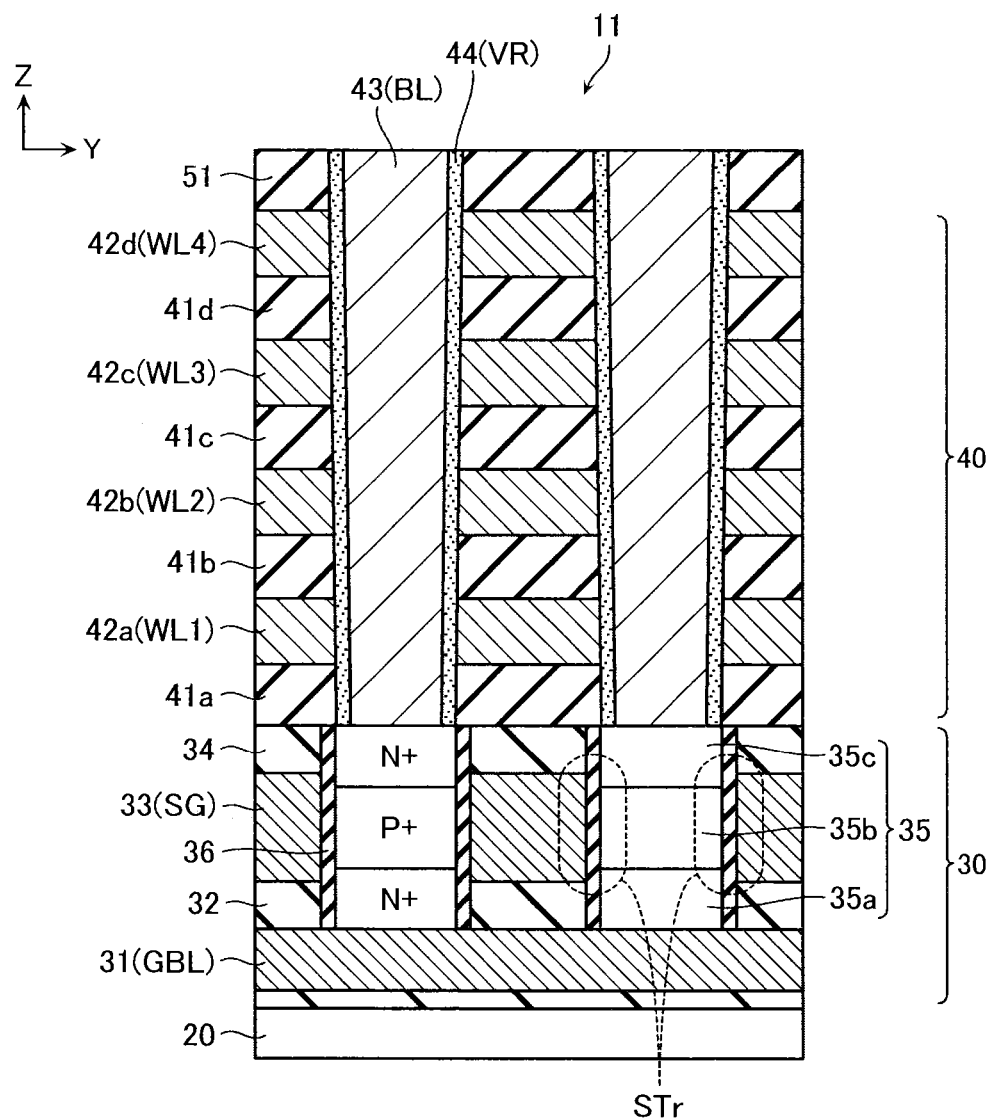
FIG. 4 is an example of a cross-sectional view taken along the line F4-F4 of FIG. 3.
Figure 5:
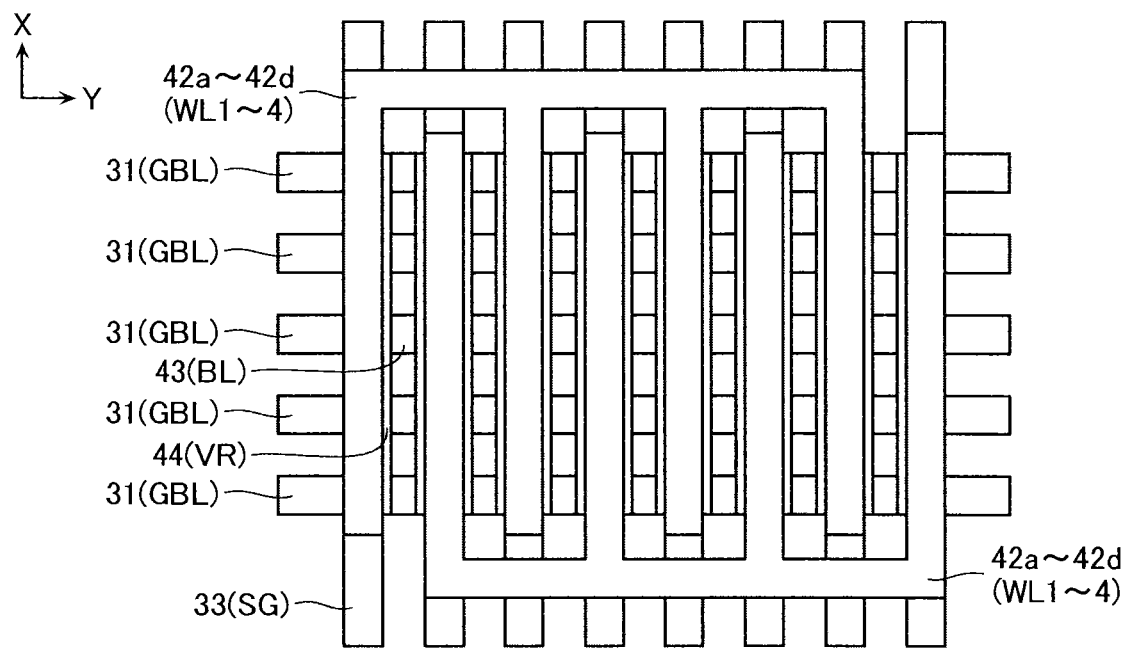
FIG. 5 is an example of a top view of FIG. 3.

Next, a stacked structure of the memory cell array 11 according to the first embodiment will be described with reference to FIGS. 3, 4, and 5. FIG. 4 is an example of a cross-sectional view of an F4-F4 plane of FIG. 3, and FIG. 5 is an example of a top view of FIG. 3. Note that in FIGS. 3 and 5, illustration of an interlayer insulating film is omitted.

As shown in FIGS. 3 and 4, the memory cell array 11 includes a select transistor layer 30 and a memory layer 40 that are stacked on a substrate 20. The select transistor layer 30 functions as the select transistor STr, and the memory layer 40 functions as the memory cell MC.

As shown in FIGS. 3 and 4, the select transistor layer 30 includes a conductive layer 31, an interlayer insulating film 32, a conductive layer 33, and an interlayer insulating film 34. These conductive layer 31, interlayer insulating film 32, conductive layer 33, and interlayer insulating film 34 are stacked in the Z direction perpendicular to the substrate 20. The conductive layer 31 functions as the global bit line GBL, and the conductive layer 33 functions as the select gate line SG and as the gate of the select transistor STr.

The conductive layers 31 are aligned with a certain pitch in the X direction parallel to the substrate 20, and have a striped shape extending in the Y direction (refer to FIG. 5). An interlayer insulating film is formed between a plurality of the conductive layers 31, although illustration of this in FIG. 3 is omitted.

The interlayer insulating film 32 is formed so as to cover an upper surface of the conductive layer 31, and has a role of electrically insulating between the conductive layer 31 and the select gate line SG (conductive layer 33). The conductive layers 33 are aligned with a certain pitch in the Y direction, and are formed in a striped shape extending in the X direction (refer to FIG. 5). The interlayer insulating film 34 is deposited so as to cover a side surface and an upper surface of the conductive layer 33. For example, the conductive layers 31 and 33 are configured by polysilicon. The interlayer insulating films 32 and 34 are configured by silicon oxide ($SiO_2$).

In addition, as shown in FIGS. 3 and 4, the select transistor layer 30 includes, for example, a column-shaped semiconductor layer 35 and a gate insulating layer 36. The semiconductor layer 35 functions as a body (channel) of the select transistor STr, and the gate insulating layer 36 functions as a gate insulating film of the select transistor STr.

The semiconductor layers 35 are disposed in a matrix in the X and Y directions, and extend in the Z direction. In addition, the semiconductor layer 35 contacts the upper surface of the conductive layer 31, and contacts a side surface in the Y direction of the conductive layer 33 via the gate insulating layer 36. Moreover, the semiconductor layer 35 includes, stacked from below to above, an N+ type semiconductor layer 35a, a P+ type semiconductor layer 35b, and an N+ type semiconductor layer 35c.

As shown in FIGS. 3 and 4, the N+ type semiconductor layer 35a contacts the interlayer insulating film 32 via the gate insulating layer 36 at a side surface in the Y direction of the N+ type semiconductor layer 35a. The P+ type semiconductor layer 35b contacts a side surface of the conductive layer 33 via the gate insulating layer 36 at a side surface in the Y direction of the P+ type semiconductor layer 35b. The N+ type semiconductor layer 35c contacts the interlayer insulating film 34 via the gate insulating layer 36 at a side surface in the Y direction of the N+ type semiconductor layer 35c. The N+ type semiconductor layers 35a and 35c are configured by polysilicon implanted with an N+ type impurity, and the P+ type semiconductor layer 35b is configured by polysilicon implanted with a P+ type impurity. The gate insulating layer 36 is configured by, for example, silicon oxide ($SiO_2$). Note that a barrier metal layer may be formed between the semiconductor layer 35 and a later-described conductive layer 43, and between the semiconductor layer 35 and the conductive layer 31 (illustration of this in FIG. 4 is omitted).

As shown in FIGS. 3 and 4, the memory layer 40 includes, stacked alternately in the Z direction, interlayer insulating films 41a to 41d and conductive layers 42a to 42d. The conductive layers 42a to 42d function as the word lines WL1 to WL4, respectively. The conductive layers 42a to 42d, when viewed from the Z direction, each include a pair of comb tooth shapes facing each other in the X direction (refer to FIG. 5). That is, word lines WLiR (i=1 to 4) belonging to one of the pair of comb tooth shaped conductive layers and word lines WLiL belonging to the other of the pair of comb tooth shaped conductive layers are formed alternately in the Y direction (refer to FIG. 2). Adopting this comb tooth shaped conductive layer enables the number of contacts connecting to the word lines WL to be reduced. Note that the interlayer insulating films 41a to 41d are configured by, for example, silicon oxide ($SiO_2$), and the conductive layers 42a to 42d are configured by, for example, polysilicon.

In addition, as shown in FIGS. 3 and 4, the memory layer 40 includes, for example, a column-shaped conductive layer 43 and a variable resistance layer 44. The conductive layer 43 functions as the bit line BL. The variable resistance layer 44 functions as the variable resistance element VR.

The conductive layers 43 are disposed in a matrix in the X and Y directions, contact an upper surface of the semiconductor layer 35 at a lower end of the conductive layer 43, and extend in a columnar shape in the Z direction. An interlayer insulating film is formed between the conductive layers 43 aligned in the X direction, although illustration of this in FIG. 3 is omitted.

The variable resistance layer 44 is provided between a side surface in the Y direction of the conductive layer 43 and side surfaces in the Y direction of the interlayer insulating films 41a to 41d. In addition, the variable resistance layer 44 is provided between the side surface in the Y direction of the conductive layer 43 and side surfaces in the Y direction of the conductive layers 42a to 42d. The conductive layer 43 is configured by, for example, polysilicon, and the variable resistance layer 44 is configured by, for example, a metal oxide (for example, $HfO_x$, $Al_2O_x$, $TiO_x$, $NiO_x$, $WO_x$, $Ta_2O_x$, and so on).

Next, a setting operation, a resetting operation, and a read operation in the nonvolatile semiconductor memory device of such a structure will be described.

When executing the setting operation that changes a certain selected memory cell MC from the high-resistance state to the low-resistance state, a selected global bit line GBL corresponding to the bit line BL to which that memory cell MC is connected is applied with a certain setting voltage Vset, and the other non-selected global bit lines GBL are applied with, for example, 0 V. In addition, a selected word line WL to which the selected memory cell MC is connected is applied with, for example, 0 V, while the other non-selected word lines are applied with a voltage Vset/2 which is half of the setting voltage Vset. Moreover, the select transistor STr to which said bit line BL is connected is selectively rendered conductive, and the other select transistors are maintained in a non-conductive state. As a result, the setting voltage Vset is applied only to the selected memory cell MC, and the setting operation is performed.

In addition, when executing the resetting operation that changes a certain selected memory cell MC from the low-resistance state to the high-resistance state, a selected global bit line GBL corresponding to the bit line BL to which that memory cell MC is connected is applied with a certain resetting voltage Vreset, and the other non-selected global bit lines GBL are applied with, for example, 0 V. In addition, a selected word line WL to which the selected memory cell MC is connected is applied with, for example, 0 V, while the other non-selected word lines are applied with a voltage Vreset/2 which is half of the resetting voltage Vreset. Moreover, the select transistor STr to which said bit line BL is connected is selectively rendered conductive, and the other select transistors are maintained in a non-conductive state. As a result, the resetting voltage Vreset is applied only to the selected memory cell MC, and the resetting operation is performed.

In the read operation that reads a state of a memory cell MC, a selected global bit line GBL corresponding to the bit line BL to which that memory cell MC is connected is applied with a certain read voltage Vread, and the other non-selected global bit lines GBL are applied with, for example, 0 V. In addition, a selected word line WL to which the selected memory cell MC is connected is applied with, for example, 0 V, while the other non-selected word lines are applied with a voltage Vread/2 which is half of the read voltage Vread. Moreover, the select transistor STr to which said bit line BL is connected is selectively rendered conductive, and the other select transistors are maintained in a non-conductive state. As a result, the read voltage Vread is applied only to the selected memory cell MC, and the read operation is performed.

In this way, a switching operation is repeated in the select transistors STr in the various kinds of operations, hence deterioration of the select transistors STr sometimes advances as the number of times of executions of the various kinds of operations increases. Continuing the various kinds of operations not knowing that a deterioration state is advancing may be a cause of an incorrect setting operation, an incorrect resetting operation, or data change. Accordingly, the nonvolatile semiconductor memory device of the first embodiment is configured to be capable of executing the following kind of operation.

Figure 6:
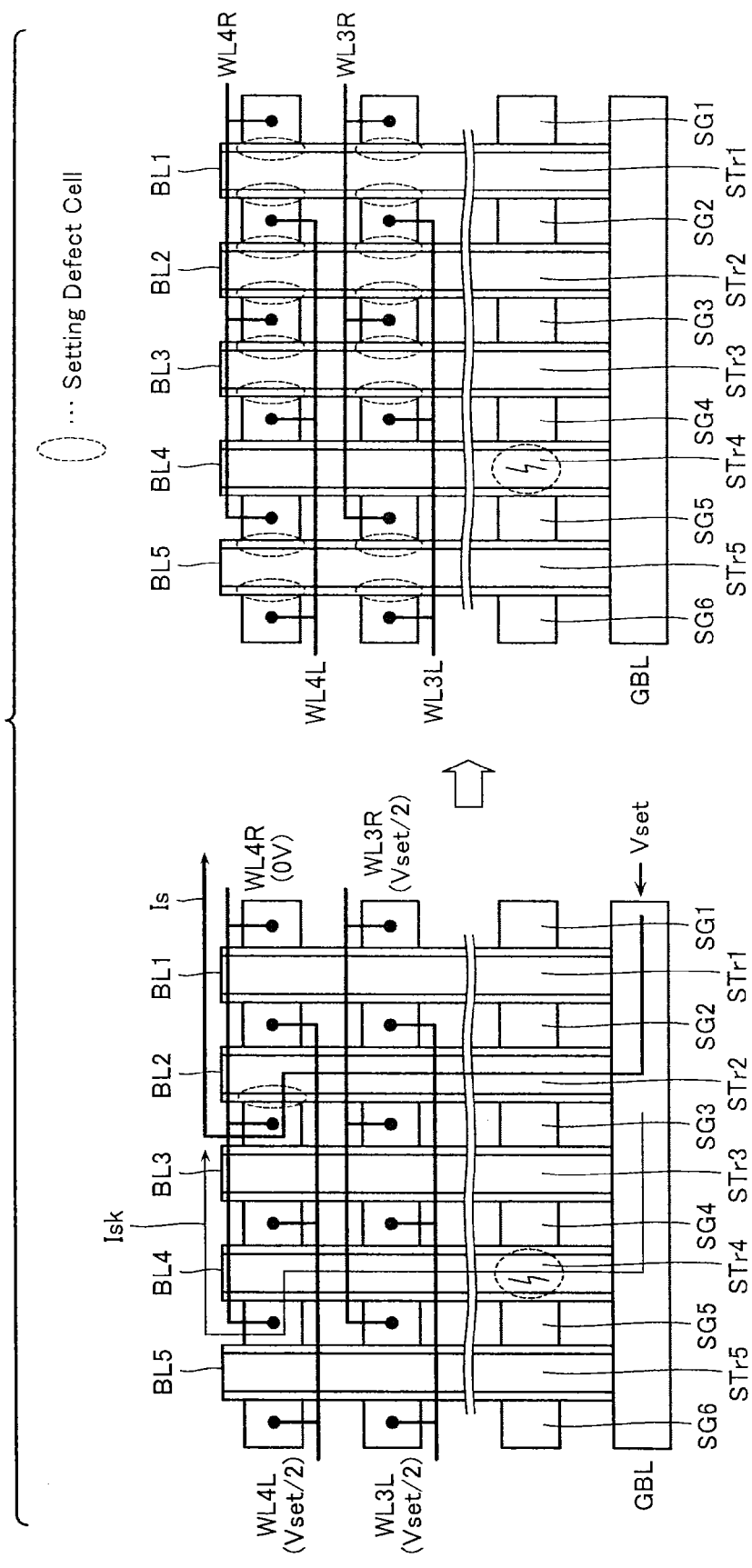
FIG. 6 is an example of a conceptual diagram explaining a problem in a conventional technology.

A redundancy operation (defect substitution operation) in the nonvolatile semiconductor memory device of the present embodiment will be described with reference to FIGS. 6 to 11. In the redundancy operation, the deterioration state of the select transistor is determined, and the redundancy operation is executed based on a result of that determination First, before describing the operation of the embodiment, an operation of a comparative example will be described with reference to FIG. 6. FIG. 6 shows the case where a select transistor STr4 which is one of a plurality of select transistors STr whose one ends are connected to one global bit line GBL is deteriorated, and a leak current is increased. FIG. 6 explains a situation when, in this state, the setting operation is executed on any of the memory cells connected to the bit lines BL connected to the global bit line GBL. Note that n (n is an integer of 2 or more) bit lines BL and select transistors STr are disposed with respect to one global bit line GBL, and FIG. 6 shows the case where n=5 (same applies also to FIG. 9).

As shown in FIG. 6, the following case is considered as an example, namely the case where the setting operation is performed on one memory cell connected to a bit line BL2. In this case, the control circuit 16 applies a gate voltage Vg1 only to a select transistor STr2 to turn the select transistor STr2 on, and on the other hand provides 0 V to gates of the other select transistors STr to cause the other select transistors STr to turn off. In addition, the control circuit 16 applies the setting voltage Vset to the selected global bit line GBL (a voltage of the other global bit lines GBL which are in a perpendicular direction to a plane of paper is set to, for example, 0 V, although illustration of this in FIG. 6 is omitted). The control circuit 16 provides 0 V to a selected word line WL4R, and on the other hand provides the voltage Vset/2 which is half of the setting voltage Vset to non-selected word lines other than the selected word line WL4R. Note that provided a resistance state of the memory cell MC connected to the non-selected word line is not changed, a voltage different from the voltage Vset/2 may be applied to the non-selected word line. Moreover, there is no need to provide the same voltage to all of the non-selected word lines, and the non-selected word lines may be applied with a voltage that differs according to a non-selected word line.

If a select transistor STr4 is not deteriorated and has a sufficient switching function as a selection element, then a setting current Is flows from the global bit line GBL to the bit line BL2 via the select transistor STr2, whereby the setting operation on the selected memory cell is executed normally. However, if the select transistor STr4 is deteriorated and does not function sufficiently as a selection element, then a leak current Ilk flows from the global bit line GBL to a bit line BL4 via the select transistor STr4. If this leak current Ilk increases, then the setting current Is flowing in the bit line BL2 decreases, and there is a possibility that the setting operation on the selected memory cell (operation that changes a resistance value of the memory cell from the high-resistance state to the low-resistance state) becomes unable to be executed normally (such a situation is referred to below as a "setting defect"). Moreover, as shown on a right side of FIG. 6, when this leak current Ilk is large, there is a possibility that the setting defect occurs in all of the memory cells connected to the global bit line GBL in which the deteriorated select transistor STr4 is connected. When the number of deteriorated select transistors increases, the possibility of the setting defect occurring further increases. Moreover, similarly, a situation of the resetting operation being unable to be performed normally (resetting defect) may occur also in the resetting operation (operation that changes a resistance value of the memory cell from the low-resistance state to the high-resistance state).

In the nonvolatile semiconductor memory device of the present embodiment, the control circuit 16 is configured capable of detecting the deterioration state of the select transistor by performing an operation described below, and of executing the redundancy operation depending on a result of that detection.

[Operations]

Figure 7:
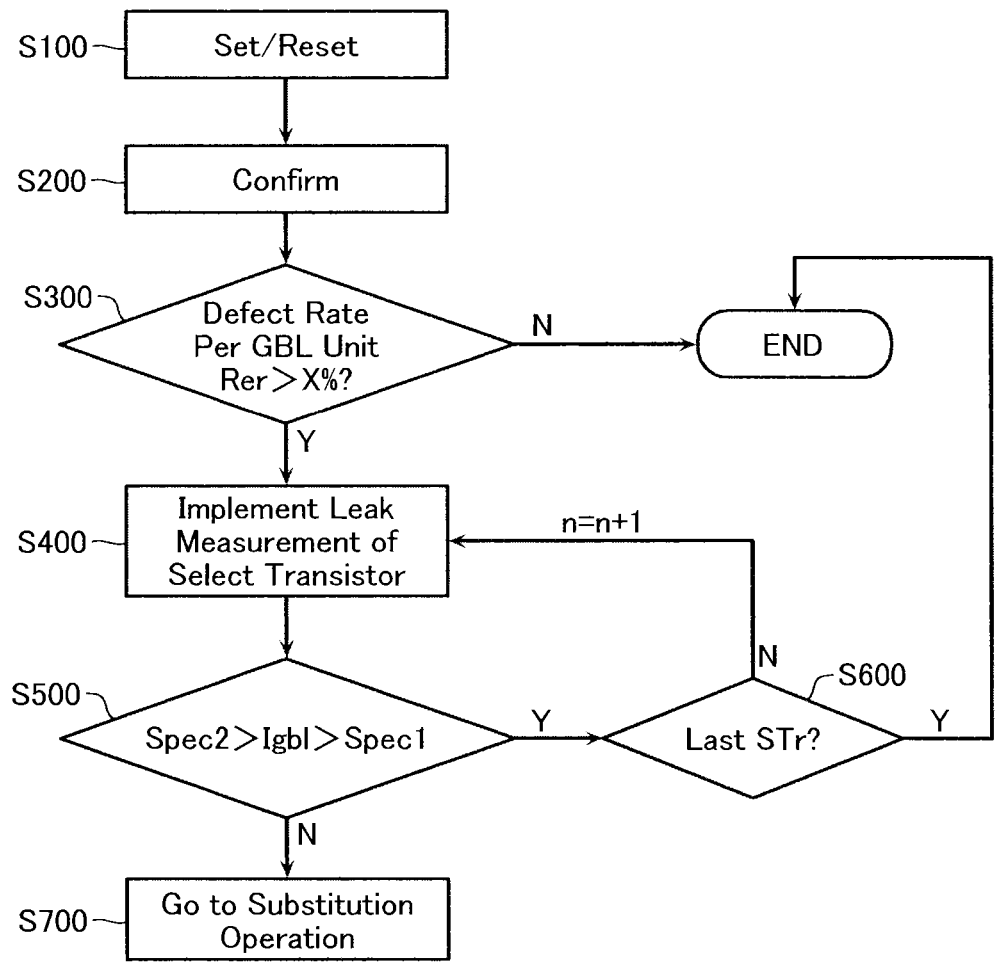
FIG. 7 is an example of a flowchart explaining an operation of the nonvolatile semiconductor memory device of the first embodiment.

Operations of the nonvolatile semiconductor memory device of the first embodiment will be described below with reference to the flowcharts of FIGS. 7 and 8.

First, the setting operation/resetting operation on a plurality of the memory cells in the memory cell array 11 is performed (step S100). The setting operation/resetting operation is performed on, for example, one page (2k bytes) of memory cells. It is also possible that the plurality of memory cells are divided into units of a certain number of memory cells, and the setting operation/resetting operation are performed multiple times on the memory cells on a divided-unit basis. For example, when performing the setting operation/resetting operation on 64 memory cell units of memory cells connected to one global bit line GBL, the setting operation/resetting operation may be performed 64 times.

Next, the memory cells on which the setting operation/resetting operation has been performed undergo a confirmation operation (verify operation) that confirms whether data which was intended to be written by the setting operation/resetting operation has been written accurately to the memory cell MC or not (step S200). Step S200 can be performed after the setting operation/resetting operation has been performed on the plurality of memory cells MC connected to the one global bit line GBL. For example, in step S200, a read operation on a selected memory cell is executed, and an operation that determines a resistance state (high-resistance state or low-resistance state) of the selected memory cell is performed. On the other hand, data that should be stored in each of the memory cells MC may be stored in a sense amplifier circuit (not illustrated) included in the column decoder 13, or some other external circuit (not illustrated). In step S200, the control circuit 16 compares data actually read from the memory cell MC and data held in the likes of the sense amplifier circuit and determines whether desired data has been written accurately in the memory cell MC or not.

As a result of determination, the number of memory cells MC that are among the plurality of memory cells connected to that global bit line GBL and in which desired data has been written accurately is divided by the number of memory cells MC in which write has been performed, thereby calculating the divided value (defect rate Rer). This value Rer is compared with a threshold value (x (%)) (step S300). As a result of comparison, if it is determined that the defect rate Rer is larger than the threshold value x (%), then the operation shifts to step S400. If the defect rate Rer is less than or equal to the threshold value x (%), then the setting operation/resetting operation is ended.

In step S400, in the global bit line GBL for which it has been determined that the defect rate Rer is higher than the threshold value x (%), leak determination that determines a degree of leak of the select transistor STr is performed. An example of an execution procedure of this leak determination will be described with reference to FIGS. 9 and 10.

Figure 9:
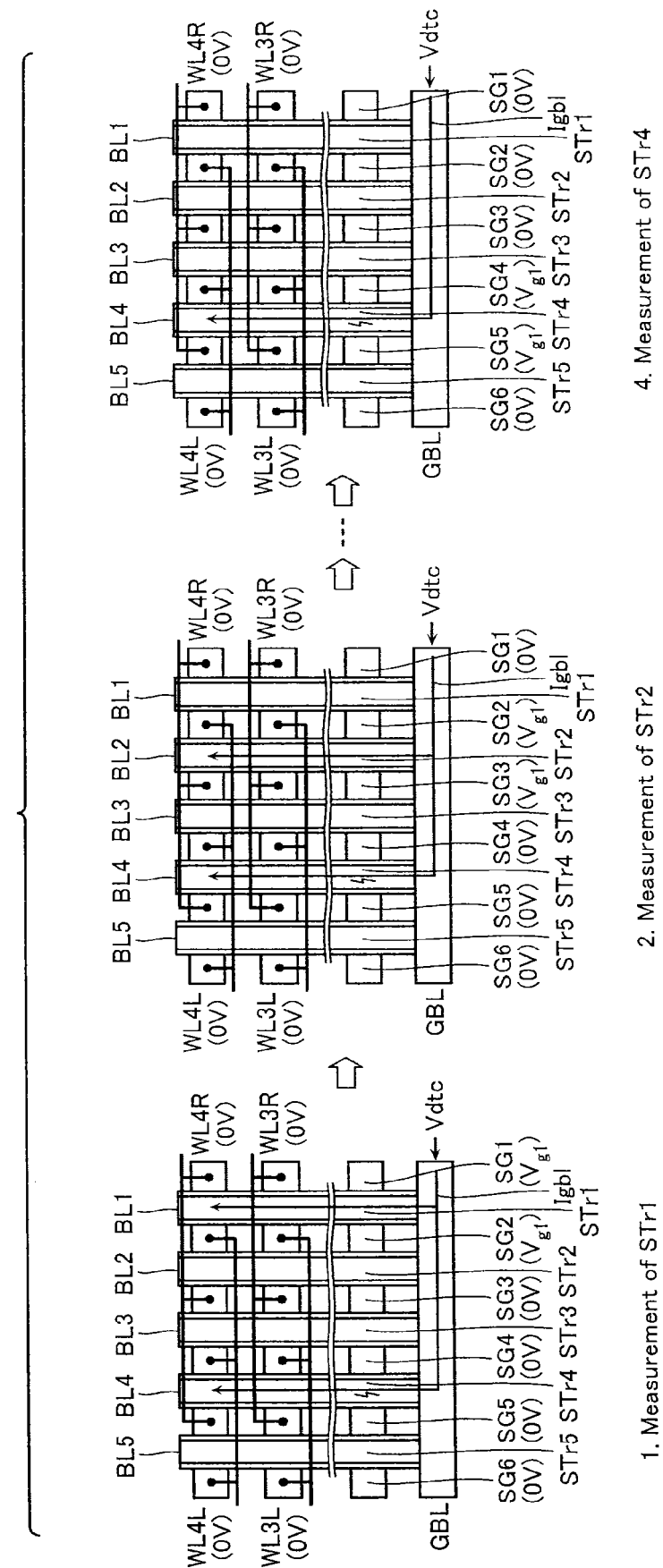
FIG. 9 is a conceptual diagram showing an example of an execution procedure of leak determination of a select transistor STr.
Figure 10:
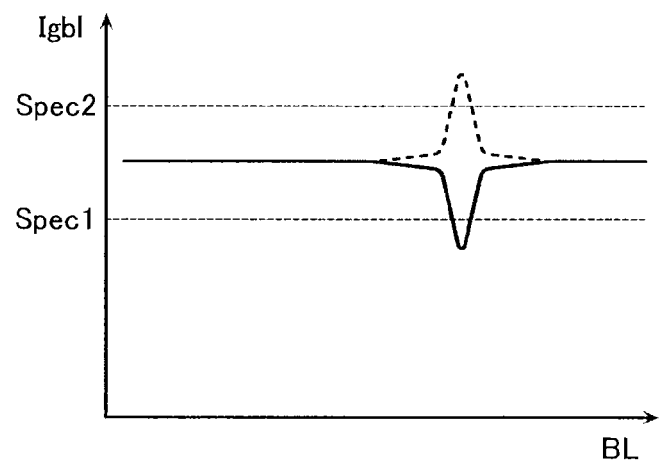
FIG. 10 is a conceptual diagram showing an example of an execution procedure of leak determination of a select transistor STr.

First, the control circuit 16 applies a voltage Vdtc to the global bit line GBL for which it has been determined that the defect rate Rer is larger than the threshold value x (%) (a voltage of the other global bit lines GBL is maintained at a voltage smaller than this voltage Vdtc, for example, 0 V). On the other hand, the control circuit 16 applies 0 V to all of the word lines WL1R to WL4R and WL1L to WL4L. Then, the control circuit 16 applies an on-voltage Vg1 to a gate of at least one of the plurality of select transistors STr connected to the global bit line GBL, for example, STr1 (to the select gate lines SG1 and SG2), and applies an off voltage (for example, 0 V) to gates of the other select transistors STr. As a result, only one of the select transistors STr is set to a conductive state (ON state), while the other select transistors STr are set to a non-conductive state (OFF state). In this state, a current Igb1 flowing in the global bit line GBL is determined by the likes of the sense amplifier circuit included in the column decoder 13. Then, as shown in FIG. 9, at least one select transistor is set to a conductive state sequentially (1., 2., ..., 4.) to determine the current Igb1 flowing in the global bit line GBL in each case. Specifically, as shown in FIG. 10, a change in the current Igb1 flowing in the global bit line GBL is detected, and it is determined whether the current Igb1 has a value between a lower limit value Spec1 and an upper limit value Spec2 or not (S500).

If the value of the current Igb1 is between the lower limit value Spec1 and the upper limit value Spec2, it is determined that the select transistor STr in that state is not deteriorated. Then, the operation shifts to the next select transistor STr, and a similar measurement is repeated to the final select transistor STr4 (S600).

On the other hand, if the value of the current Igb1 has fallen below the lower limit value Spec1 in a leak measurement of a certain select transistor STr, a select transistor STr under selection is assumed to have a defect. Then, the procedure shifts to step S700, and a redundancy operation is executed.

Moreover, if the value of the current Igb1 has exceeded the upper limit value Spec2 in a leak measurement of a certain select transistor STr, it is determined that some of the memory cells MC connected to the bit line BL to which that select transistor Str under selection is connected are defective. Also in this case, the procedure shifts to step S700 and a redundancy operation is executed. Note that in this leak measurement shown in FIGS. 7 to 10, it is also possible to configure the procedure such that a defect of the memory cell MC is not detected, and only a defect of the select transistor STr is detected. In that case, it is sufficient for the current Igb1 to be compared only with the lower limit value Spec1.

If the current Igb1 is no less than the lower limit value Spec1 and no more than the upper limit value Spec2 in the leak measurement of all of the select transistors STr, then the setting operation/resetting operation is ended.

Figure 11A:
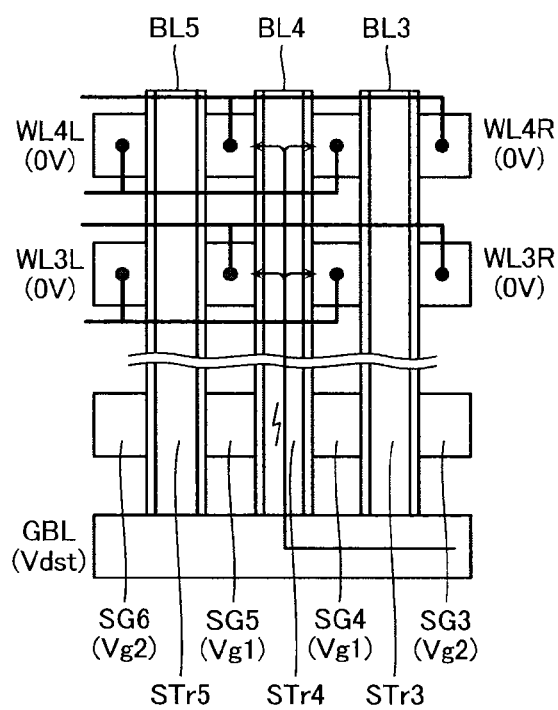
FIG. 11A is a conceptual diagram showing an example of a procedure of a redundancy operation of a defective select transistor STr.

Next, a specific example of a procedure of this redundancy operation (S700) will be described with reference to the flowchart of FIG. 8 and the conceptual diagrams of FIGS. 11A and 11B.

In step S800, the control circuit 16 applies a high voltage to the select transistor STr that has been determined defective in the leak determination operation. As a result, the defective select transistor STr4 is destroyed (destruction operation). Specifically, as shown in FIG. 11A, the control circuit 16 applies the previously-mentioned voltage Vg1 to the gate of the defective select transistor STr4 (to the select gate lines SG4 and SG5), and on the other hand applies a voltage Vdst which is larger than the previously-mentioned voltage Vdtc (for example, about 7 to 10 V) to the corresponding global bit line GBL.

In addition, the control circuit 16 provides, for example, 0 V to all of the word lines WL. As a result, the defective select transistor STr4 is destroyed and the select transistor STr4 is changed to a state of not turning on. Note that in step S700, gates of the select transistors other than the defective select transistor STr4 are applied with a voltage Vg2 (<Vg1), and these select transistors are not destroyed. In addition, the control circuit 16 maintains a voltage of the global bit lines GBL other than the corresponding global bit line GBL at, for example, 0 V.

After step S800 finishes, in step S900, the control circuit 16 again applies identical voltages to those during the previously-mentioned leak determination (step S400) to the word lines WL, the bit line BL (bit line BL4 to which the defective select transistor STr4 is connected), and the global bit line GBL, and it is determined whether the current Igb1 of the global bit line GBL in this state is smaller than an upper limit value Spec3 or not. Note that the upper limit value Spec3 may also be set the same as the upper limit value Spec2. If Igb1>=Spec3, then it is determined that destruction of the select transistor STr has not sufficiently advanced, the procedure returns to step S800, and the destruction operation of the select transistor STr is re-executed. On the other hand, if Igb1<Spec3, then destruction of the select transistor STr is assumed to have been completed, and a redundancy operation on the bit line BL or global bit line GBL that includes this destroyed select transistor STr is performed (S1000). Whether the redundancy operation is conducted in units of the bit line BL, or the redundancy operation is conducted in units of the global bit line GBL may be determined according to factors such as the number of defective select transistors STr connected to the global bit line GBL, magnitude of the previously-mentioned defect rate Rer, current Igb1, and so on.

Figure 11B:
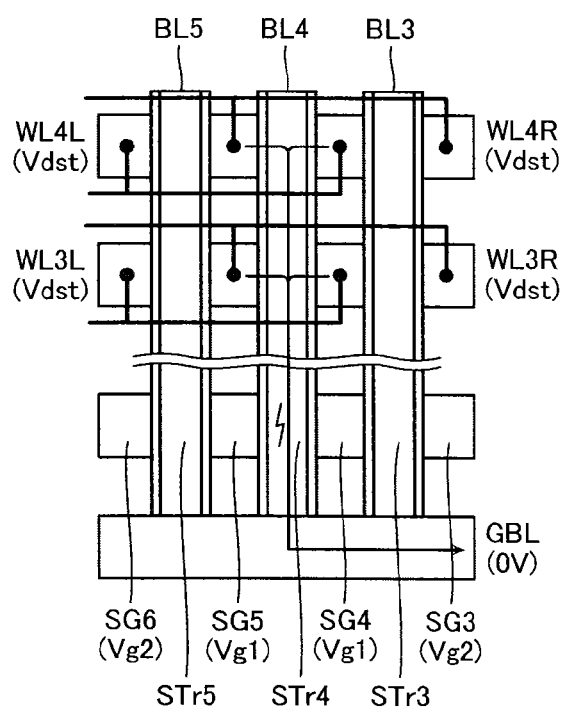
FIG. 11B is a conceptual diagram showing an example of a procedure of a redundancy operation of a defective select transistor STr.

Note that as shown in FIG. 11B, the control circuit 16 can execute the above-mentioned destruction operation also by applying 0 V to the global bit line GBL and applying the voltage Vdst to all of the word lines WL. Note that a voltage applied to the gate of the select transistor STr4 to be destroyed may be the voltage Vg1, or may be a low voltage at which an ordinary select transistor STr cannot be turned on.

Modified Example 1

Figure 12A:
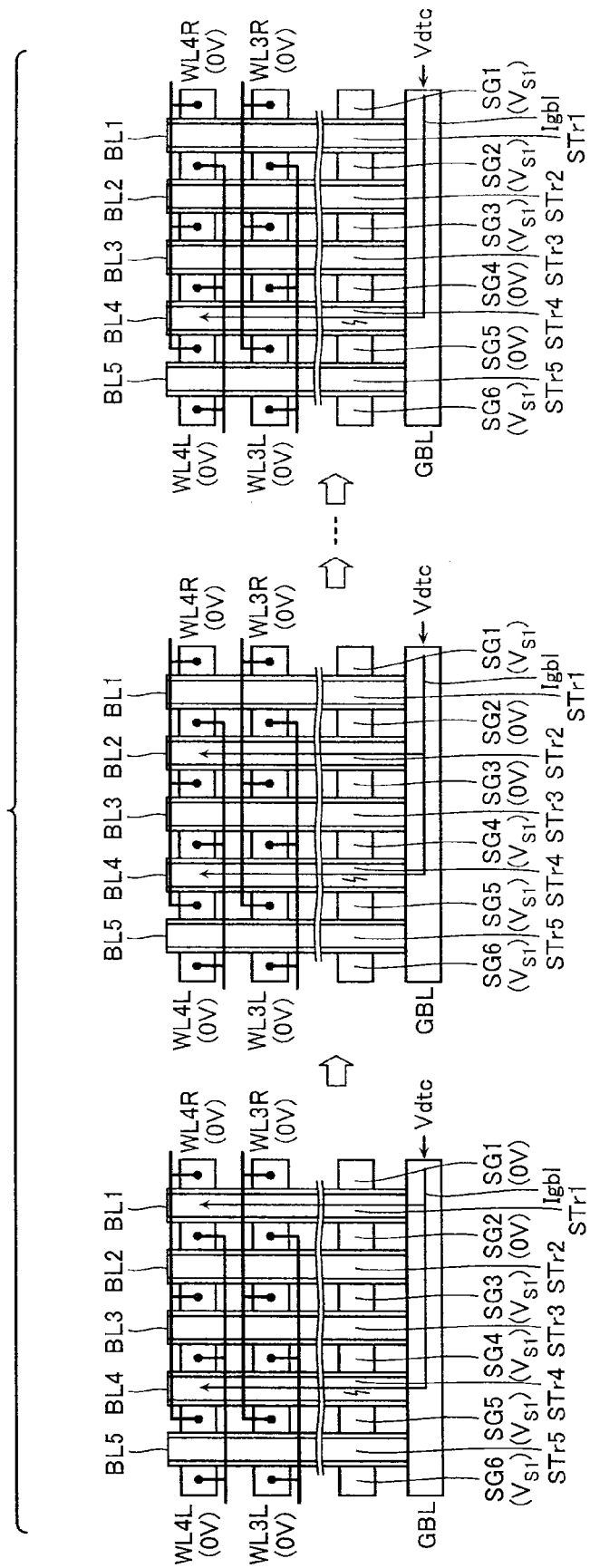
FIG. 12A is a conceptual diagram showing an example of an execution procedure of leak determination of a select transistor STr in modified example 1 of the first embodiment.
Figure 12B:
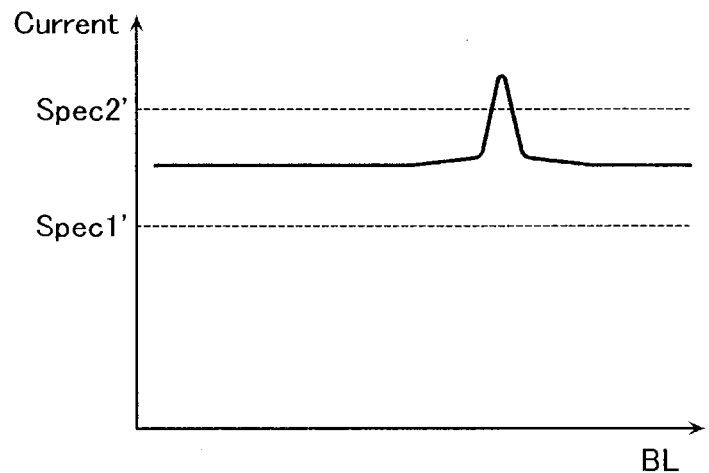
FIG. 12B is a conceptual diagram showing an example of an execution procedure of leak determination of a select transistor STr in modified example 1 of the first embodiment.

FIGS. 12A and 12B are each a conceptual diagram explaining a leak measurement operation (S400) in a modified example of the first embodiment. In this modified example, the control circuit 16 applies the off voltage (for example, 0 V) only to the gate of one of the select transistors STr that is to be a target of leak determination, and applies an on-voltage Vs1 to the gates of the other of the select transistors STr, thereby setting the select transistors STr that are non-target of leak determination to a conductive state. Thereafter, setting of only the gate of the determination-target select transistor to 0 V is performed sequentially.

In the case that a defective select transistor STr is selected when such an operation is performed, it may occur that the current Igb1 exceeds an upper limit value Spec2'. In this modified example, the defective select transistor STr can be detected by comparing the upper limit value Spec2' with the current Igb1.

Modified Example 2

Figure 8:
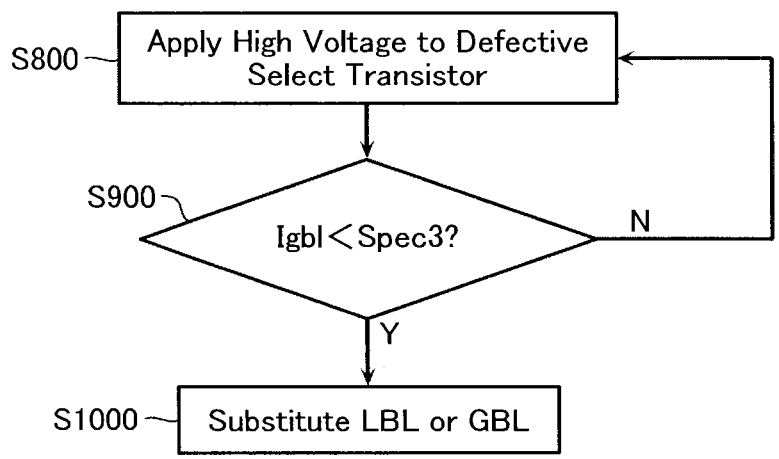
FIG. 8 is an example of a flowchart explaining an operation of the nonvolatile semiconductor memory device of the first embodiment.
Figure 13A:
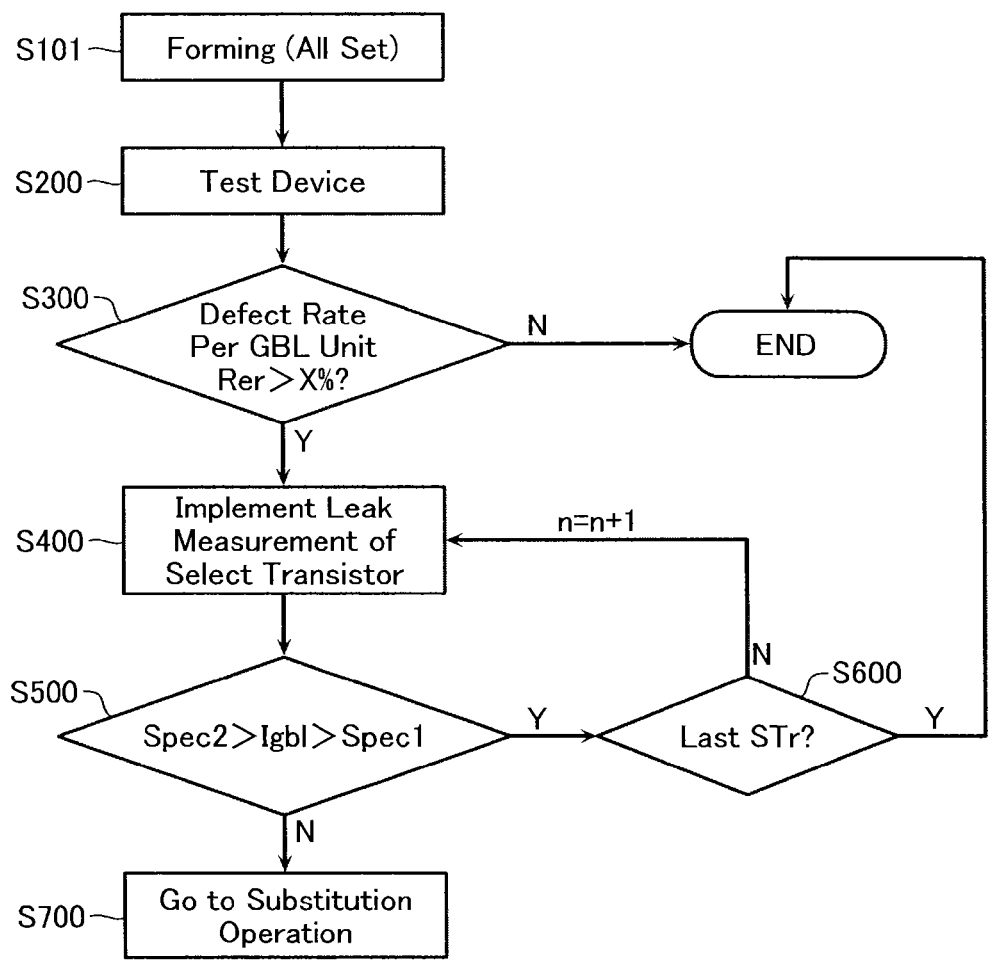
FIG. 13A is an example of a flowchart explaining an operation of a nonvolatile semiconductor memory device according to modified example 2 of the first embodiment.

In the first embodiment, it is also possible to execute the operations of FIG. 13A and FIG. 8 (select transistor leak test) using a test device (tester) during a die-sort test at wafer level prior to dicing.

Figure 13B:
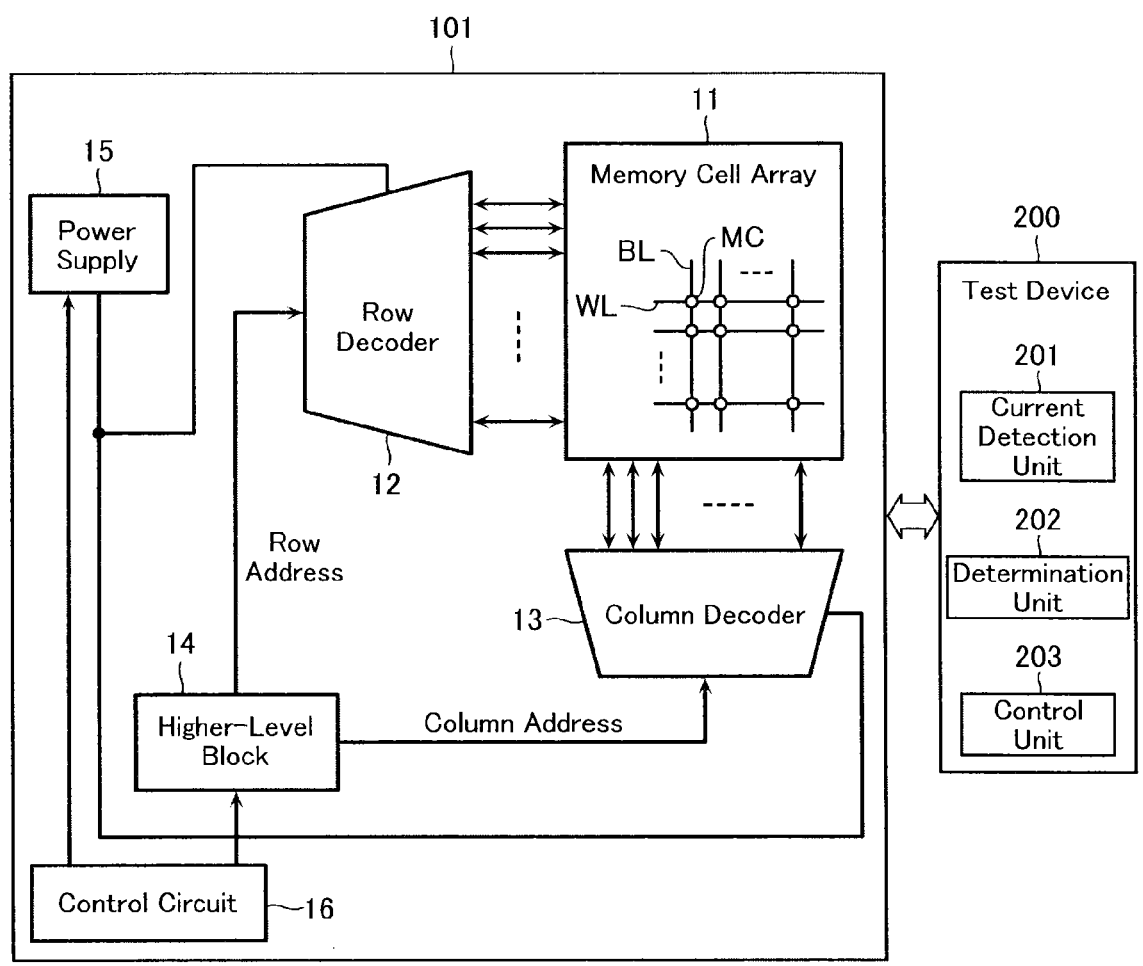
FIG. 13B is an example of a block diagram of the semiconductor memory device according to modified example 2 of the first embodiment.

FIG. 13B shows an example of a block diagram of a test device 200. The test device 200 can adopt as its test target a wafer having a plurality of semiconductor memory devices 101 disposed therein. That is, the test device 200 can perform a test on the plurality of semiconductor memory devices 101 formed in one wafer, individually or simultaneously. Now, the test device 200 can perform operations of the kind shown in the flowcharts of FIG. 13A and FIG. 8.

The test device 200 comprises, for example, a current detection unit 201, a determination unit 202, and a control unit 203. The current detection unit 201 includes a function of detecting, for example, whether a certain current has flowed or not based on a determination result of a current detected by, for example, a sense amplifier circuit of the semiconductor memory device 101, when the operations of FIGS. 7 and 8 are executed. Note that the current detection unit 201 may also be configured to detect various kinds of currents directly without mediation of the sense amplifier circuit, and so on. The determination unit 202 executes a later-described determination operation based on a determination operation by the semiconductor memory device 101 or a detection result of the current detection unit 201. The control unit 203 includes a function of executing control of the semiconductor memory device 101.

The operations of FIG. 13A and FIG. 8 using the test device 200 will be described below.

When executing the operations of FIG. 13A and FIG. 8, the control unit 203 causes the forming operation to be performed on the semiconductor memory device 101 (step S101). Now, after the forming operation, the control unit 203 sets all of the memory cells MC to the low-resistance state (All Set). Note that the control unit 203 may also set all of the memory cells MC to the high-resistance state. Hereafter, the description will proceed using the case where all of the memory cells MC are in the low-resistance state. Now, the confirmation operation (verify operation) that detects whether the memory cell is in the low-resistance state or not is performed (step S200). In step S200, the determination unit 202 of the test device 200 determines whether data actually read from the memory cell MC is in the low-resistance state or not.

The determination unit 202 of the test device uses a result of determination to calculate the defect rate Rer, and this defect rate Rer is compared to the threshold value (x (%)), similarly to in the first embodiment. As a result of comparison, if it is determined that the defect rate Rer is larger than the threshold value x (%), then the operation shifts to step S400. If the defect rate is less than or equal to the threshold value x (%), then the select transistor leak test is ended.

In step S400, the global bit line GBL for which it has been determined by the determination unit 202 that the defect rate Rer is higher than the threshold value x (%) undergoes leak determination that determines a degree of leak of the select transistor STr. An execution procedure of this leak determination may be performed similarly to in the first embodiment, under control of the test device 200. For example, the control unit 203 of the test device sends a command to the semiconductor memory device 101 to apply the voltage Vdtc to the global bit line GBL for which it has been determined that the defect rate Rer is larger than the threshold value x (%) (the voltage of the other global bit lines GBL is maintained at a voltage smaller than this voltage Vdtc, for example, 0 V). On the other hand, the control unit 203 of the test device 200 issues an instruction to the semiconductor memory device 101 to apply 0 V to all of the word lines WL1R to WL4R and WL1L to WL4L. Then, the control unit 203 of the test device 200 sends a command to the semiconductor memory device 101 to apply the on-voltage Vg1 to the gate of at least one of the plurality of select transistors STr connected to the global bit line GBL, for example, STr1 (to the select gate lines SG1 and SG2), and apply the off voltage (for example, 0 V) to the gates of the other select transistors STr. As a result, only one of the select transistors STr is set to a conductive state (ON), while the other select transistors STr are set to a non-conductive state (OFF). In this state, the current Igb1 flowing in the global bit line GBL is determined by the likes of the sense amplifier circuit included in the column decoder 13, and the semiconductor memory device sends a result of that determination to the test device 200. The current detection unit 201 of the test device 200 detects a magnitude of the current Igb1 according to that determination result.

Then, as shown in FIG. 9, the test device 200 sends a command to the semiconductor memory device 101 to sequentially render conductive at least one select transistor STr (1., 2., . . . , 4.) to determine the current Igb1 flowing in the global bit line GBL in each case. Specific operation of the semiconductor memory device 101 is substantially similar to in the first embodiment (FIG. 10, and S500 and S600).

Now, in a leak measurement of a certain select transistor STr, if it is detected by the current detection unit 201 that the value of the current Igb1 has fallen below the lower limit value Spec1, then that select transistor STr under selection is assumed to have a defect, and the test device 200 executes the redundancy operation on the semiconductor memory device 101, similarly to in the first embodiment.

Moreover, in a leak measurement of a certain select transistor STr, the test device 200 may execute the redundancy operation on the semiconductor memory device 101 similarly to in the first embodiment, also in the case where the value of the current Igb1 has exceeded the upper limit value Spec2.

If the current Igb1 is no less than the lower limit value Spec1 and no more than the upper limit value Spec2 in the leak measurement of all of the select transistors STr, then the select transistor leak test is ended.

Next, a specific example of a procedure of this redundancy operation (S700) will be described with reference to the flowchart of FIG. 8 and the conceptual diagrams of FIGS. 11A and 11B.

In step S800, the control unit 203 of the test device 200 sends a command to the semiconductor memory device 101 to apply a high voltage to the select transistor STr that has been determined defective in the leak determination operation (destruction operation).

Specific operation of the semiconductor memory device 101 is similar to in the first embodiment.

When step S800 finishes, the control unit 203 of the test device 200 sends a command to the semiconductor memory device 101 to again apply identical voltages to those during the previously-mentioned leak determination (step S400) to the word lines WL, the bit line BL (bit line BL4 to which the defective select transistor STr4 is connected), and the global bit line GBL (step S900). The control unit 203 of the test device 200 determines whether the current Igb1 of the global bit line GBL in this state is smaller than the upper limit value Spec3 or not. The subsequent determination operation S1000 is similar to in the first embodiment.

Note that the test device 200 may also cause the semiconductor memory device 101 to perform an operation of the kind shown in FIG. 11B.

Modified Example 3

Figure 13C:
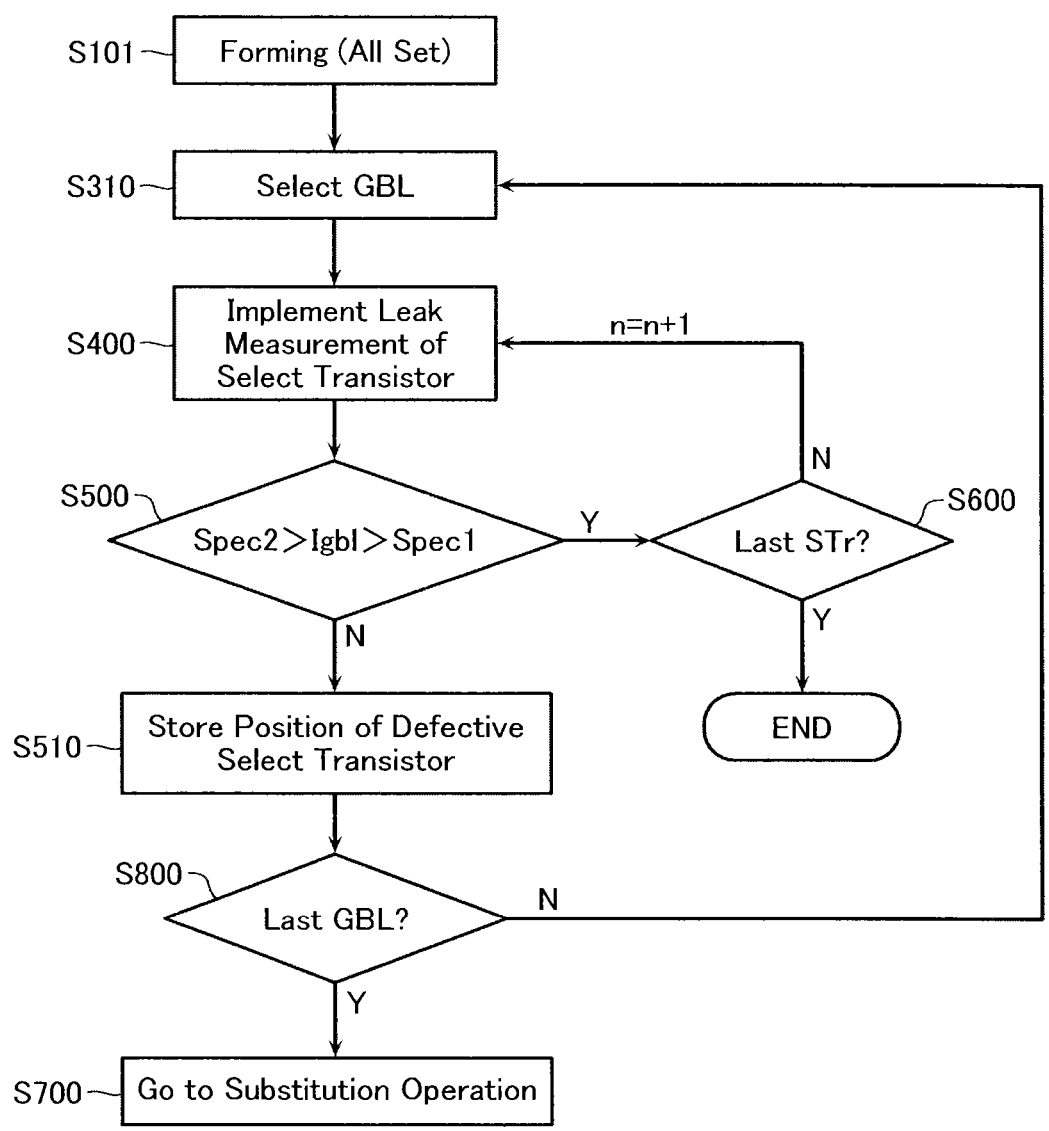
FIG. 13C is an example of a flowchart explaining an operation of a nonvolatile semiconductor memory device according to modified example 3 of the first embodiment.

The die-sort test described in modified example 2 is also capable of executing the operations of FIG. 13C and FIG. 8 using the test device (tester).

In FIG. 13C, the control unit 203 causes the forming operation to be performed on the semiconductor memory device 101 (step S101). Now, after the forming operation, the control unit 203 sets all of the memory cells MC to, for example, the low-resistance state (All Set). Note that the control unit 203 may also set all of the memory cells MC to the high-resistance state. Hereafter, the description will proceed using the case where all of the memory cells MC are in the low-resistance state.

Next, in step S310, one of the global bit lines GBLs is selected from the plurality of global bit lines GBL. Next, steps S400, S500, and S600 may be performed similarly to in modified example 2.

Now, as shown in FIG. 13C, when the value of the current Igb1 has fallen below the lower limit value Spec1 in a leak measurement of a certain select transistor STr, or when the value of the current Igb1 has exceeded the upper limit value Spec2 in a leak measurement of a certain select transistor STr, the test device 200 stores a position of this select transistor STrf in a storage region 204 (step S510).

Now, when leak measurement of all of the select transistors STr connected to the one selected global bit line GBLs has finished (Y in step S600), the next global bit line GBL is selected. Now, when there is no next global bit line GBL (Y in step S800), the test device 200 performs the redundancy operation S700.

Now, the redundancy operation may be performed similarly to in modified example 2.

Figure 13D:
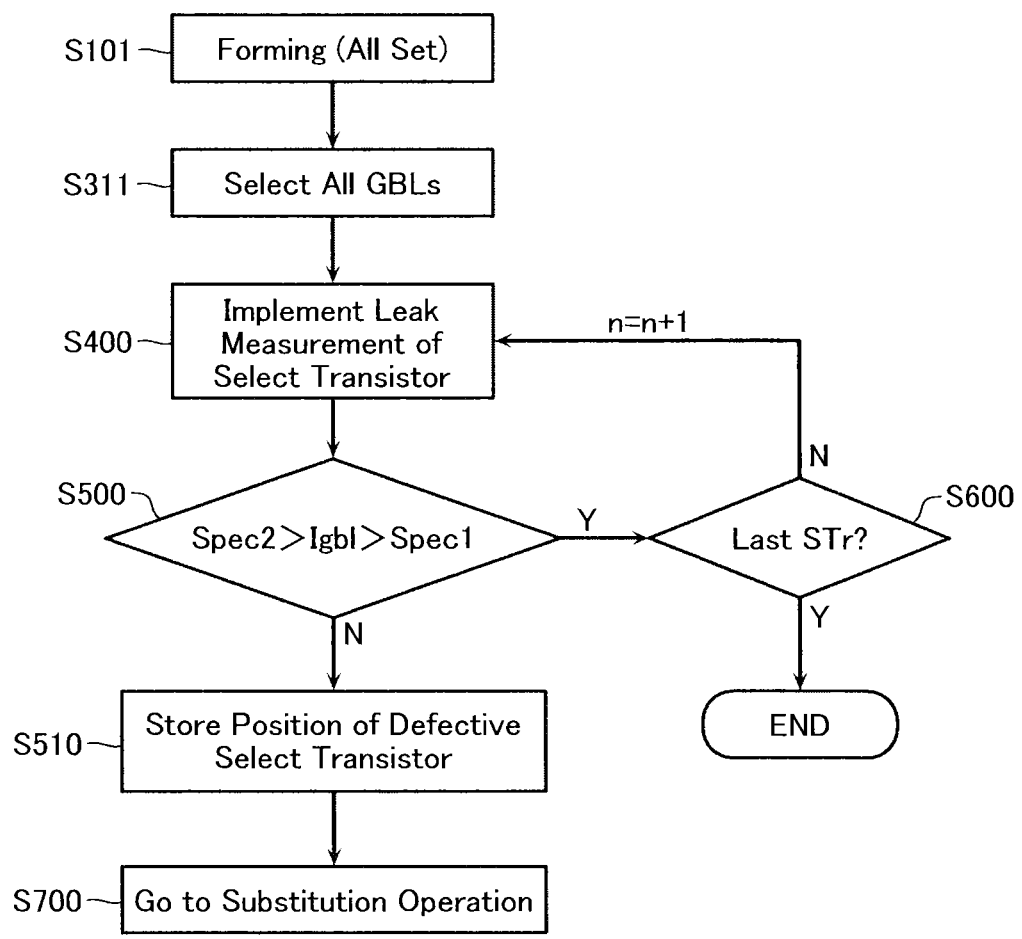
FIG. 13D is another example of a flowchart explaining an operation of the nonvolatile semiconductor memory device according to modified example 3 of the first embodiment.

In addition, as shown in FIG. 13D, it is also possible to select all of the global bit lines GBL at once to perform leak measurement of the select transistor STr. As a result, the select transistor leak test can be performed at high speed.

Second Embodiment

Figure 14:
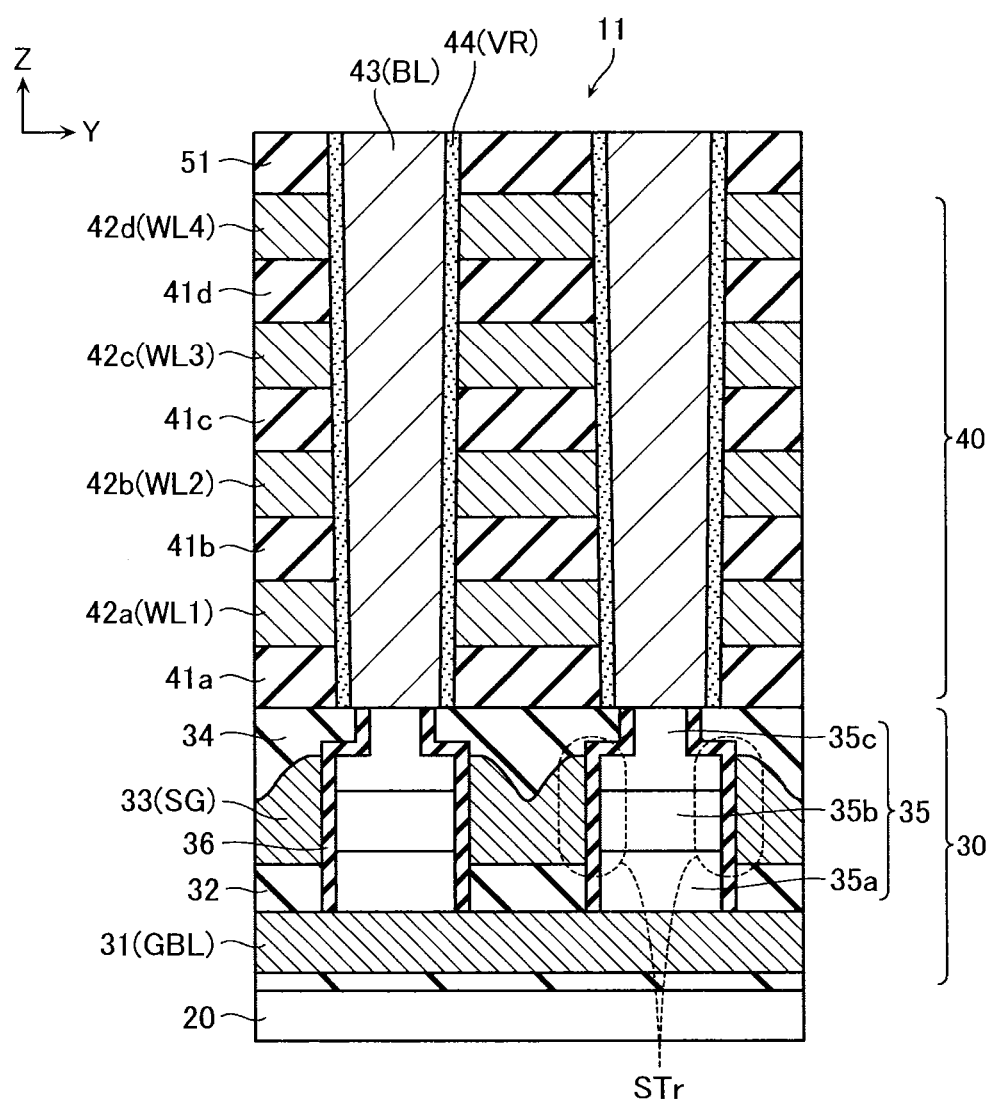
FIG. 14 is an example of a cross-sectional view taken along the line F4-F4 showing a stacked structure of a memory cell array 11 according to a second embodiment.

Next, a semiconductor memory device according to a second embodiment will be described with reference to FIG. 14. In FIG. 14, configurative elements identical to those of the first embodiment are assigned with identical reference symbols to those assigned in the first embodiment, and a detailed description of those configurative elements is omitted below.

An overall configuration of this semiconductor memory device of the second embodiment is identical to that of the first embodiment (FIGS. 1 to 3). However, in this embodiment, a structure of the F4-F4 cross-section of FIG. 3 is different to that of the first embodiment (FIG. 4).

That is, in this second embodiment, as shown in FIG. 14, a width of part of the select transistor STr, for example, at least a part of the N+ type semiconductor layer 35c is narrowed compared to that of other portions (35a and 35b) of the select transistor STr. Due to this configuration, the destruction operation S800 of the select transistor STr can be easily executed (a disconnection operation can be completed by a lower voltage). In exchange for the width of the N+ type semiconductor layer 35c being narrowed, a width of the interlayer insulating film 34 is broadened compared to that of the first embodiment. Note that a barrier metal layer of titanium nitride (TiN) or the like may be formed between the semiconductor layer 35 and a later-described conductive layer 43, and between the semiconductor layer and the conductive layer 31. In addition, the conductive layer 33 is formed via the gate insulating layer 36 only on a portion of the semiconductor layer 35 where a width in the Y direction of the semiconductor layer 35 is broad. Moreover, an upper surface of the conductive layer 33 is recessed, and in the Y direction, a central vicinity of the conductive layer 33 is lowest.

Next, a method of manufacturing a portion of the select transistor STr of the second embodiment will be described with reference to FIGS. 15A to 15H.

Figure 15A:
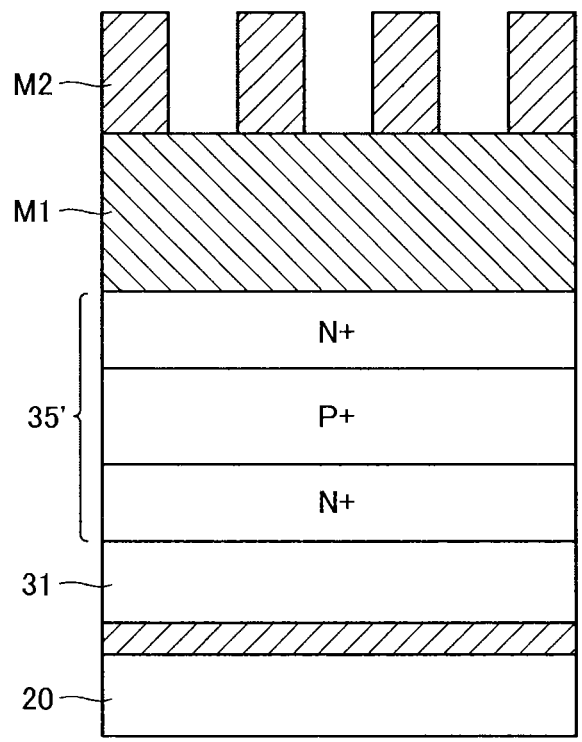
FIGS. 15A to 15H are each an example of a process diagram showing a manufacturing process of a select transistor STr in the memory cell array 11 according to the second embodiment.

First, as shown in FIG. 15A, the conductive layer 31 acting as the global bit line GBL is formed in stripes on the substrate 20, and then, sequentially, a polysilicon layer 35' that is to be the semiconductor layer 35 configured from titanium nitride (TiN) is deposited sequentially thereon, using a chemical vapor deposition (CVD) method, or the like. A hard mask M1 is formed thereon, and resist M2 is further deposited thereon. The resist M2 undergoes patterning in a striped shape having the X direction as a long direction, by photolithography. The polysilicon layer 35' may be deposited having added thereto, from a lower layer, n type, p type, and n type impurities.

Figure 15B:
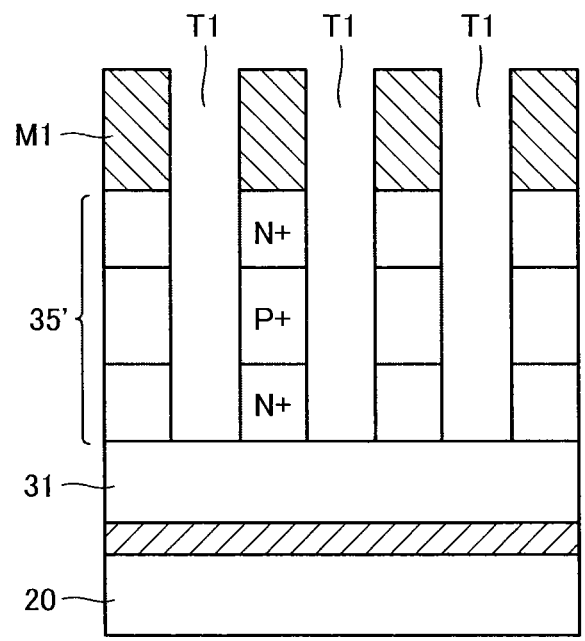
Figure 15C:
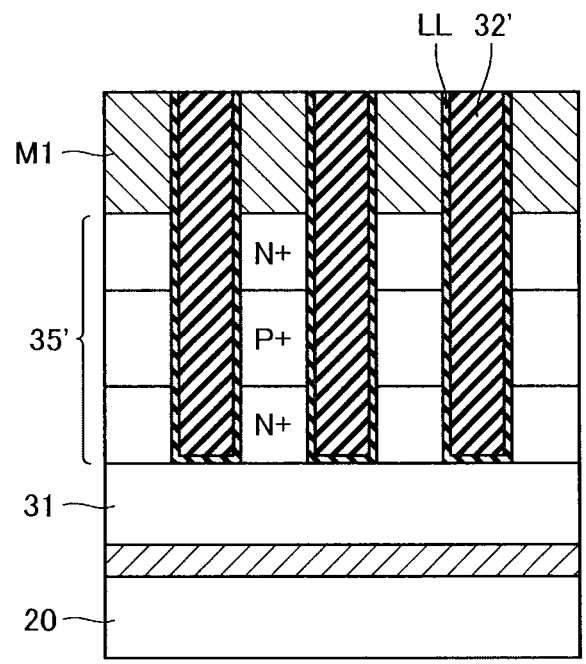
Figure 15D:
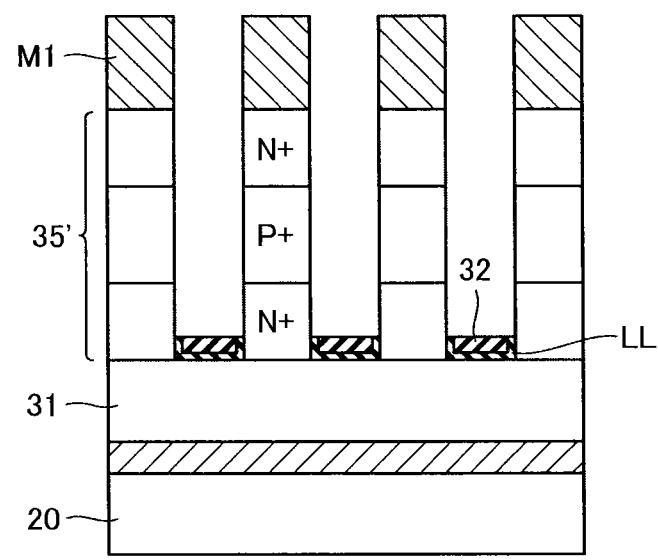

Then, as shown in FIG. 15B, reactive ion etching (RIE) adopting the resist M2 as a mask is executed to perform etching of the hard mask M1, a barrier metal layer 38, and the semiconductor layer 35, and form a plurality of trenches T1 having the X direction as a long direction. Then, as shown in FIG. 15C, CVD is employed to deposit a liner film LL configured from silicon nitride along a sidewall and a bottom surface of these trenches T1, and then fill this trench T1 with a silicon oxide film 32'. Then, as shown in FIG. 15D, the liner film LL and the silicon oxide film 32' are etched back to form the interlayer insulating film 32. Now, an upper surface of the liner film LL and the silicon oxide film 32' can be made lower than an upper surface of lower-side n-type layer which is in the lower side of the n-type polysilicon layer 35'.

Figure 15E:
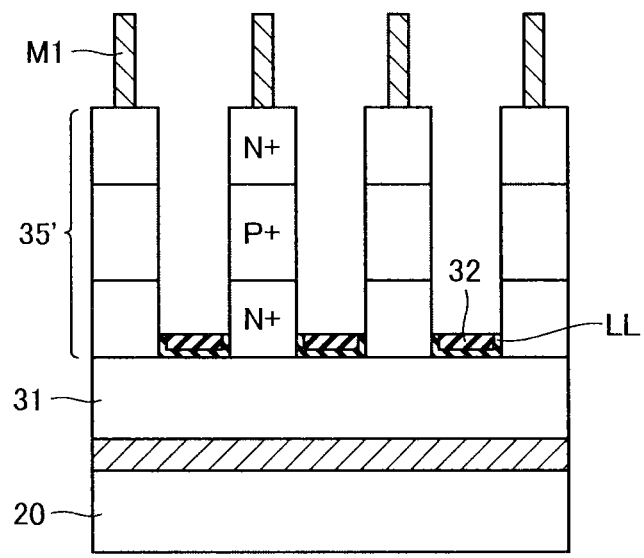
Figure 15F:
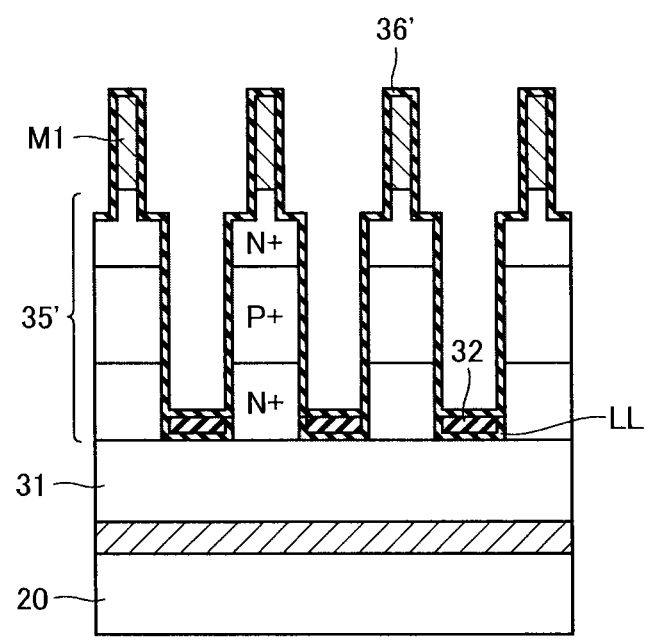
Figure 15G:
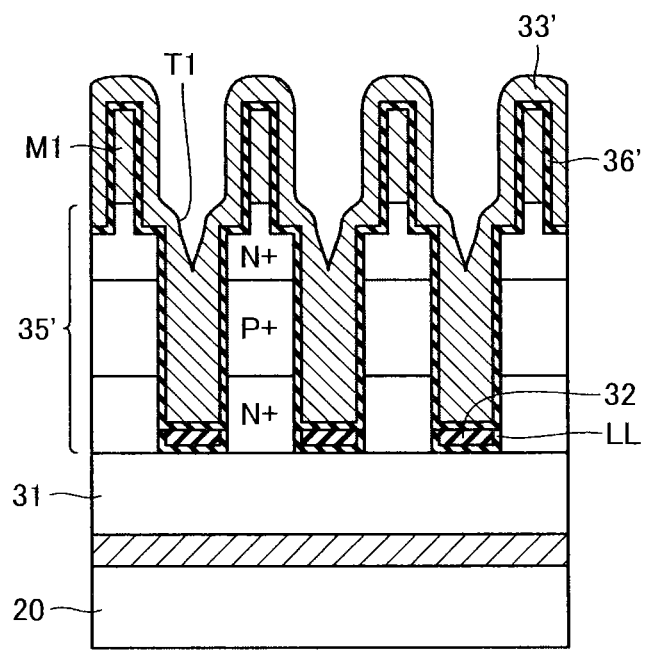

Then, as shown in FIG. 15E, a line width of the hard mask M1 undergoes thinning (slimming) by, for example, wet etching. Following this, as shown in FIG. 15F, etching of an upper portion of the polysilicon layer 35' is performed by anisotropic etching adopting the hard mask M1 as a mask. Here, an upper portion of the n type polysilicon layer 35' on an upper side is etched. Next, an atomic layer deposition method (ALD method) is executed to form, on an upper surface of the slimmed hard mask M1 and an entire surface including an inner wall of the trench T1, a silicon oxide film 36' that is to be the gate insulating layer 36. Now, the silicon oxide film 36' is formed with a film thickness that does not fill the trench T1. Furthermore, as shown in FIG. 15G, a CVD method is executed to deposit, on an entire surface including above the silicon oxide film 36', a polysilicon film 33' which is to be the select gate line 33. At this time, the polysilicon film 33' does not completely fill the trench T1, but is filled into the trench T1 such that a recession (hollow) is created in an upper portion of the trench T1.

Figure 15H:
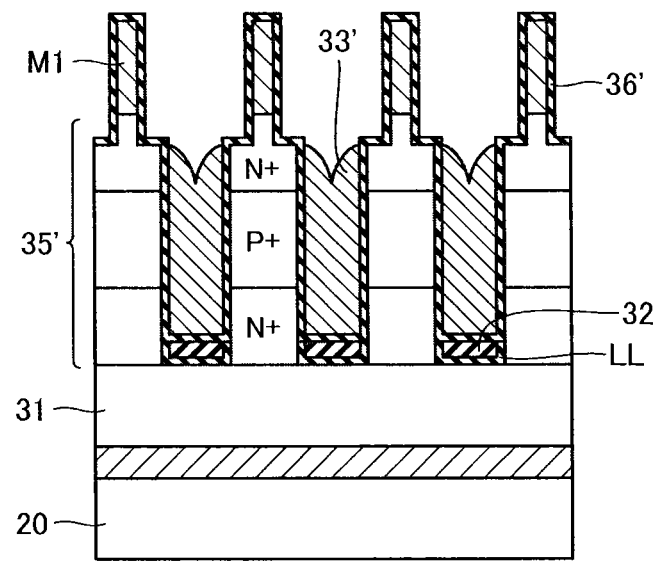

Then, as shown in FIG. 15H, this polysilicon film 33' is etched back, by wet etching, to an extent that a part of the polysilicon film 33' remains only in a bottom portion of the trench T1. As a result, the polysilicon film 33' is formed via the silicon oxide film 36' only on a portion of the semiconductor layer 35' where a width in the Y direction of the semiconductor layer 35' is narrow. Moreover, an upper surface of the polysilicon film 33' is depressed, and in the Y direction, a central vicinity of the polysilicon film 33' is lowest. Thereafter, although not illustrated in the drawings, a silicon oxide film is deposited so as to fill the trench T1, thereby filling in an interlayer insulating film. As a result, a shape of FIG. 14 is completed.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a plurality of first lines disposed in a first direction perpendicular to a main surface of a substrate and extending in a second direction parallel to the main surface of the substrate;
    a plurality of second lines disposed in the second direction and extending in the first direction, the plurality of second lines intersecting the plurality of first lines;
    a plurality of memory cells disposed at intersections of the plurality of first lines and the plurality of second lines and including a variable resistance element;
    a third line configured to extend in a third direction crossing the first direction and the second direction;

a select transistor connected between the second line and the third line; and a control circuit being configured to set at least one of a plurality of the select transistors to a conductive state and thereby detect a current flowing in the third line, and to determine a deterioration state of the select transistor according to a result of the detection, wherein the control circuit is configured to, after a setting operation or a resetting operation on the memory cell, execute a first determination operation that determines whether desired data has been written in the setting operation or the resetting operation or not, and, depending on a result of the first determination operation, start a second determination operation that determines the deterioration state of the select transistor.

2. The semiconductor memory device according to claim 1, wherein the control circuit is configured to, according to the deterioration state of the select transistor, execute an operation that destroys a deteriorated select transistor.

3. The semiconductor memory device according to claim 1, wherein the control circuit is configured to, when, in the first determination operation, a defect rate of the plurality of memory cells connected to one third line exceeds a first value, execute the second determination operation.

4. The semiconductor memory device according to claim 1, wherein the control circuit is configured to sequentially set a plurality of the select transistors connected to one third line to a conductive state, and by detecting a change in a current flowing in the third line so as to determine the deterioration state of the elect transistor.

5. The semiconductor memory device according to claim 4, wherein the control circuit is configured to, when a first select transistor of a plurality of the select transistors is selected, and the current flowing in the third line is larger than a first value, determine that the first select transistor is deteriorated.

6. The semiconductor memory device according to claim 4, wherein the control circuit is configured to, when a first select transistor of a plurality of the select transistors is selected and the current flowing in the third line is smaller than a second value, determine that the first select transistor is deteriorated.

7. The semiconductor memory device according to claim 1, wherein the select transistor comprises:

a semiconductor layer having one end connected to the third line and the other end connected to the second line; and a conductive layer that contacts the semiconductor layer via an insulating layer, and a width of part of the semiconductor layer is narrower compared to that of another portion thereof.

8. A test device for testing a semiconductor memory device, the semiconductor memory device comprising:

a plurality of first lines disposed in a first direction perpendicular to a main surface of a substrate and extending in a second direction parallel to the main surface of the substrate;

a plurality of second lines disposed in the second direction and extending in the first direction, the plurality of second lines intersecting the plurality of first lines;

a plurality of memory cells disposed at intersections of the plurality of first lines and the plurality of second lines and including a variable resistance element;

a third line extending in a third direction orthogonal to the first direction and the second direction; and a select transistor connected between the second line and the third line, the test device comprising:

a detection unit that set at least one of a plurality of the select transistors to a conductive state and thereby detects a current flowing in the third line;

a determination unit that determines a deterioration state of the select transistor according to a result of detection; and a control unit, wherein the control unit, after a setting operation or a resetting operation on the memory cell, determines whether desired data has been written in the setting operation or the resetting operation or not, and the control unit, depending on a result of determination, starts in the semiconductor memory device an operation that determines the deterioration state of the select transistor.

9. The test device according to claim 8, wherein the control unit, according to the deterioration state of the select transistor, executes an operation that destroys a deteriorated select transistor.

10. The test device according to claim 8, wherein the control unit sequentially sets a plurality of the select transistors connected to one third line to a conductive state, and the control unit, by detecting a change in a current flowing in the third line so as to determines the deterioration state of the select transistor.

\* \* \* \* \*